United States Patent
Hunt

(10) Patent No.: US 12,149,239 B2
(45) Date of Patent: Nov. 19, 2024

(54) SWITCHED CURRENT SOURCE CIRCUITS

(71) Applicant: Socionext Inc., Kanagawa (JP)

(72) Inventor: Kenneth Stephen Hunt, Maidenhead (GB)

(73) Assignee: SOCIONEXT INC., Kanagawa (JP)

( * ) Notice: Subject to any disclaimer, the term of this patent is extended or adjusted under 35 U.S.C. 154(b) by 31 days.

(21) Appl. No.: 18/149,421

(22) Filed: Jan. 3, 2023

(65) Prior Publication Data

US 2023/0238954 A1   Jul. 27, 2023

(30) Foreign Application Priority Data

Jan. 21, 2022   (EP) .................................... 22152827

(51) Int. Cl.
*H03K 17/687* (2006.01)
*H03K 17/06* (2006.01)
*H03K 19/08* (2006.01)
*H03M 1/66* (2006.01)

(52) U.S. Cl.
CPC .......... *H03K 17/687* (2013.01); *H03K 17/06* (2013.01); *H03K 19/08* (2013.01); *H03M 1/66* (2013.01)

(58) Field of Classification Search
None
See application file for complete search history.

(56) References Cited

U.S. PATENT DOCUMENTS

| | | | | |
|---|---|---|---|---|
| 5,493,543 | A * | 2/1996 | Kamens | H02M 3/07 368/255 |
| 5,790,393 | A * | 8/1998 | Fotouhi | H02M 3/07 363/60 |
| 6,563,447 | B1 | 5/2003 | Schofield | |
| 6,967,609 | B1 | 11/2005 | Bicakci et al. | |
| 7,960,949 | B2 * | 6/2011 | Schoofs | H02M 7/4837 323/224 |
| 8,644,039 | B2 * | 2/2014 | Chuang | H02M 3/07 323/288 |
| 8,854,019 | B1 * | 10/2014 | Levesque | H02M 1/14 363/60 |
| 11,557,964 | B2 * | 1/2023 | Pullen | H02M 1/15 |
| 2002/0075705 | A1 | 6/2002 | Bayer et al. | |

(Continued)

OTHER PUBLICATIONS

Extended European Search Report dated Jul. 4, 2022 issued in the corresponding European Patent Application No. 22152827.6.

(Continued)

*Primary Examiner* — Kenneth B Wells
(74) *Attorney, Agent, or Firm* — Rimon P.C.

(57) ABSTRACT

A switched current source circuit, comprising first and second voltage source nodes; a load; a current source; and capacitor switching circuitry comprising a load node, a capacitor and a plurality of switches configured, based on a control signal, to adopt a biasing configuration followed by an active configuration, wherein in the biasing configuration, the load node is conductively connected to the second voltage source node to bias a voltage level at the load node, and the capacitor is connected so that it at least partly charges; and in the active configuration, the load node is conductively connected via the load to the first voltage source node, and via the capacitor to the current source to increase a potential difference between the first voltage source node and the load node.

18 Claims, 12 Drawing Sheets

(56) References Cited

U.S. PATENT DOCUMENTS

2005/0104651 A1   5/2005   Hashimoto
2019/0199338 A1   6/2019   Zamprogno

OTHER PUBLICATIONS

Timir Nandi et al., "Continuous-Time ΔΣ Modulators with Improved Linearity and Reduced Clock Jitter Sensitivity Using the Switched-Capacitor Return-to-Zero DAC", IEEE Journal of Solid-State Circuits, vol. 48, No. 8, Aug. 2013, pp. 1795-1805.

* cited by examiner

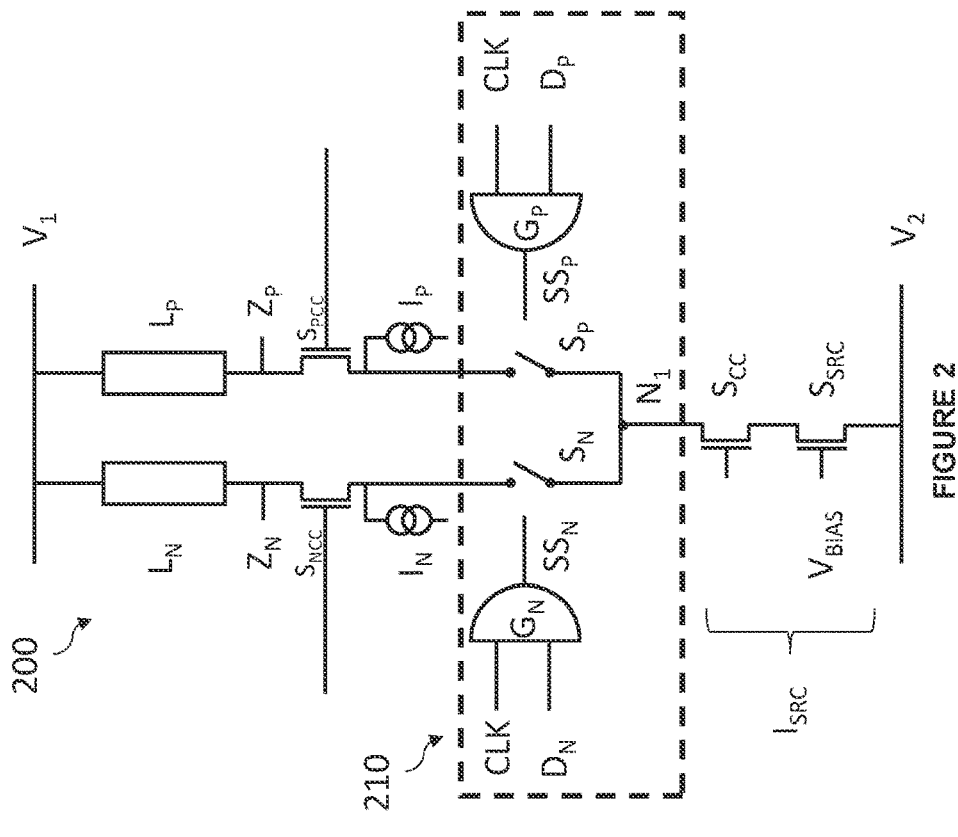
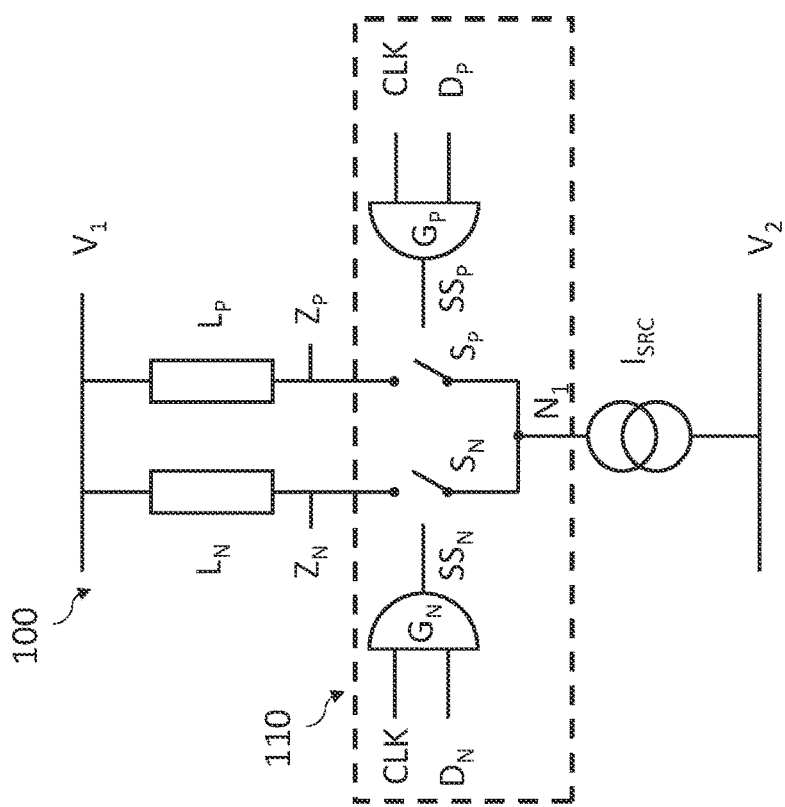
FIGURE 2
FIGURE 1

SWITCHED CURRENT SOURCE CIRCUITS

CROSS-REFERENCE OF RELATED APPLICATIONS

This application claims the benefit of European Patent Application No. 22152827.6, filed on Jan. 21, 2022, the entire disclosure of which Application is incorporated by reference herein.

The present invention relates to switched current source circuits, for example for use in digital-to-analogue converter (DAC) circuitry. The present invention accordingly relates also to DAC circuitry comprising such a switched current source converter circuit. Such switched current source converter circuits may be provided independently of DAC circuitry in some arrangements. Embodiments may be provided, for example, as (or as part of) an integrated circuit.

In order to provide context for embodiments of the present invention, aspects of a previously-considered switched current source circuit will now be considered.

FIG. 1 is a schematic diagram of a simple switched current source circuit 100, being a current-steering circuit, which may serve as (or as part of) a current-steering digital-to-analogue converter. The circuit 100 comprises a first voltage source node $V_1$, a second voltage source node $V_2$, and a load node $N_1$ (in this case, also a tail node). The first voltage source node $V_1$ may be considered VDD and the second voltage source node $V_2$ may be considered GND or ground, and may be connected to (or considered to be) corresponding voltage sources. The load node $N_1$ is (conductively) connected to the second voltage source node $V_2$ via a current source ISRC, and is also connected to the first voltage source node $V_1$ via two parallel connected paths (or branches) each path comprising a switch, an output node and a load.

Along each path, the load node $N_1$ is connected to the output node via the switch, and the output node is connected to the first voltage source node $V_1$ via the load. The first path comprises load $L_N$, output node $Z_N$ and switch $S_N$. The second path comprises load $L_P$, output node $Z_P$ and switch $S_P$. The first and second paths may be considered a differential pair, and may alternatively be referred to together as parallel connected paths or parallel paths, or singularly as a negative path and a positive path, first path and second path or path N and path P.

Both switches $S_N$ and $S_P$ are controlled by an AND logic gate, outputting a switch signal SS. Logic gate $G_N$ outputs switch signal SSN to control switch $S_N$. Logic gate $G_P$ outputs switch signal SSP to control switch $S_P$.

The logic gates $G_N$ and $G_P$, switches $S_N$ and $S_P$ and load node $N_1$ can be described together as switching circuitry 110, shown in FIG. 1 as a dashed box surrounding said components.

In this implementation, each AND logic gate comprises a clock signal (or control signal) input and a data signal input (i.e. digital input). In FIG. 1, logic gate $G_N$ has inputs CLK and $D_N$, and logic gate $G_P$ has inputs CLK and $D_P$.

Based on the values of clock signal CLK, and complementary (or differential) data signals $D_N$ and $D_P$, the switch signal SS causes one of the switches $S_N$ and $S_P$ to close (to be ON), and the other switch to open (to be OFF). The current is therefore steered, or directed, through the parallel path with the closed switch, resulting in a voltage drop across the load of that path, and a corresponding low voltage is seen at the output node (of that path).

For example, where CLK and $D_N$ are HIGH (high voltage, logic level 1, or HI) and $D_P$ is LOW (low voltage, logic level 0, or LO), the switch signal SSN of logic gate $G_N$ is HIGH and closes switch $S_N$. The switch signal $SS_P$ of logic gate $G_P$ in this case is LOW and opens switch $S_P$. Current flows along the first parallel path and a voltage is induced over the load $L_N$ and seen as a low voltage at output node $Z_N$. No current flows along the second parallel path and a high voltage is seen at output node $Z_P$. Output nodes $Z_N$ and $Z_P$ may thus be considered complementary analogue outputs corresponding to complementary digital inputs $D_N$ and D.

In another example, where CLK and $D_P$ are HIGH and $D_N$ is LOW, the switch signal $SS_P$ of logic gate $G_P$ is HIGH and closes switch $S_P$. The switch signal SSN of logic gate $G_N$ is LOW and opens switch $S_N$. Current flows along the second parallel path and a voltage is induced over the load $L_P$ at and seen as a low voltage output node $Z_P$. No current flows along the first parallel path and a high voltage is seen at output node $Z_N$.

In summary, the values of CLK, $D_P$ and $D_N$ control whether the switches $S_N$ and $S_P$ are open or closed, and direct a current into one of the loads $L_N$ or LP along the parallel connected paths.

In the present example, when $D_P$ is high, $Z_P$ is low (and $Z_N$ is high), and when $D_N$ is high, $Z_N$ is low (and $Z_P$ is high), in terms of voltage levels. Of course, the complementary (or differential) data signals $D_P$ and $D_N$ could be swapped with one another so that when $D_P$ is high, $Z_P$ is high, and so that when $D_N$ is high, $Z_N$ is high, and the present disclosure will be understood accordingly.

Such a circuit may be one of many current-steering digital-to-analogue converter circuits in an overall, larger digital-to-analogue converter. Such circuits may be binary weighted using $2^n$ similar stages (where n is an integer >0) and binary weighted voltage supplies or loads.

One disadvantage of the circuit 100 of FIG. 1 is poor linearity since, during switching between the parallel connected paths, the voltage over the current-source changes.

A solution to this problem is shown in FIG. 2, which shows a detailed circuit schematic of a switched current source circuit 200, again a current-steering circuit, similar to the circuit 100 of FIG. 1.

Circuit 200 of FIG. 2 comprises the same components previously described in relation to FIG. 1, and so repeat description will be omitted. Like reference signs have been used where possible to aid in the understanding of circuit 200. Logic gates $G_N$ and $G_P$, switches $S_N$ and $S_P$ and load node $N_1$ can be described together as switching circuitry 210 (corresponding to the switching circuitry 110 shown in FIG. 1) and shown as a dashed box surrounding said components.

Comparing circuit 200 to circuit 100, in circuit 200 each parallel connected path comprises an additional (cascode) transistor connected in series with the switch, between the output node and that switch. Along the first parallel connected path, additional transistor $S_{NCC}$ is connected between switch $S_N$ and output node $Z_N$. Along the second parallel connected path, additional transistor $S_{PCC}$ is connected between switch $S_P$ and output node $Z_P$.

Each parallel connected path also comprises a small bleed current source with a first terminal connected to a node between the additional transistor and the switch, and a second terminal connected to ground or to a different voltage source node (not shown in FIG. 2), to carry a bleed current. Along the first parallel connected path, the first terminal of the bleed current source $I_N$ is connected between switch $S_N$ and additional transistor $S_{NCC}$. Along the second parallel connected path, the first terminal of the bleed current source $I_P$ is connected between switch $S_P$ and additional transistor $S_{PCC}$. The bleed currents ensure that the additional transistors are, and remain, biased at all times. This improves the output bandwidth and settling time of the circuit 200.

The current source $I_{SRC}$ is shown in circuit 200 implemented as two transistors $S_{PCC}$ and $S_{SRC}$ connected in series with the load node $N_1$. Transistor $S_{PCC}$ can be considered as an additional (cascode) transistor and transistor $S_{SRC}$ can be considered a transistor operating as constant current source, transistor $S_{SRC}$ being controlled by a voltage signal $V_{BIAS}$. This voltage signal may be a constant, DC voltage to ensure constant current through the transistor $S_{SRC}$.

While not shown in FIG. 2 for simplicity, transistors $S_{CC}$, $S_{NCC}$ and $S_{PCC}$ may all be controlled by voltage signals.

Due to the additional transistors, the linearity of the circuit 200 may be improved compared to that of circuit 100. However, voltage drops across the additional (cascode) transistors are incurred, and the bleed current connected along each parallel connected path results in an additional voltage drop across the load (due to additional current being drawn through the load by the bleed current source). These voltage drops effectively increase a minimum voltage difference between the first and second voltage source nodes $V_1$ and $V_2$ needed for the circuitry to operate effectively, or detrimentally affect the linearity of the circuit for a given voltage difference between the first and second voltage source nodes $V_1$ and $V_2$.

It is desirable to address such problems.

According to an embodiment of a first aspect of the present invention there is provided a switched current source circuit, comprising first and second voltage source nodes, a load, a current source and capacitor switching circuitry comprising a load node, a capacitor and a plurality of switches configured, based on a control signal, to adopt a biasing configuration followed by an active configuration. In the biasing configuration, the load node is conductively connected to the second voltage source node to bias a voltage level at the load node, and the capacitor is connected so that it at least partly charges. In the active configuration, the load node is conductively connected via the load to the first voltage source node, and via the capacitor to the current source to increase a potential difference between the first voltage source node and the load node.

Switches may be implemented as transistors and may be implemented as a field-effect transistor such as a MOSFET, or as a bipolar transistor.

In the active configuration, a current controlled by the current source may cause a current to flow through the load and the load node and thereby increases the potential difference between the first voltage source node and the load node.

In the biasing configuration, the load node may be conductively connected (by a switch of the capacitor switching circuitry) directly to the second voltage source node. In the biasing configuration, the load node may be conductively disconnected (by a switch of the capacitor switching circuitry) from the first voltage source node.

In the active configuration, the load node may be conductively connected via the capacitor and the current source to the second voltage source node. The load node may be conductively connected in series with the capacitor and the current source. The load node may be conductively connected via the capacitor to the current source so that the current controlled by the current source causes current to flow on both sides of the capacitor.

The capacitor switching circuitry may be configured, based on the control signal, to alternate between the biasing configuration and the active configuration.

The control signal may comprise a clock signal. The control signal may be an input to a logic gate which may output a switch signal. The switch signal may be the output of a logic block comprising one or more logic gates, with a plurality of inputs, where one of the inputs is a clock signal and another one of the inputs is a data signal (digital signal). The switch signal may be a clock signal.

In the biasing configuration, the capacitor may be conductively connected between the second voltage source node and the first voltage source node or another voltage source node. In the biasing configuration, the capacitor may be conductively connected between the load node and the first voltage source node or another voltage source node. In the active configuration, the capacitor may be conductively connected between the load node and the current source.

The capacitor may have first and second terminals. The first terminal may be (conductively) connected to the load node in the biasing and active configurations. The capacitor switching circuitry may be configured to conductively connect the second terminal to the first voltage source node or another voltage source node in the biasing configuration and via the current source to the second voltage source node in the active configuration.

The "another voltage source node" may be a third voltage source node. In one example, the first and second voltage source nodes are configured to provide different voltage levels. In one example, the second voltage source may supply a voltage that is smaller than the first voltage source. In a further example, the third voltage source may supply a voltage that is equal to, larger than, or smaller than the first voltage source.

In the active configuration, the current source may cause a current to flow at the second terminal of the capacitor and the capacitor causes an equivalent or the same current to flow at the first terminal of the capacitor, thereby increasing said potential difference between the first voltage source node and the load node.

The first and second voltage source nodes may be configured to provide different voltage levels.

In the active configuration the voltage level at the load node may be shifted or adjusted (or moved or changed or translated or pushed or pulled) to a value further from the voltage level of the first voltage source node than the voltage level of the second voltage source node.

The switching circuitry may comprise switches $S_1$, $S_2$, $S_3$ and $S_4$. The load node may be connected via switch $S_1$ and the load to the first voltage source node, and via switch $S_3$ to the second voltage source node. The capacitor may be (conductively) connected between the load node and a node $N_2$. Node $N_2$ may be connected to the first voltage source node or another voltage source node via switch $S_4$, and via switch $S_2$ and the current source to the second voltage source node. The capacitor switching circuitry may be configured, based on the control signal, such that switches $S_3$ and $S_4$ are ON and switches $S_1$ and $S_2$ are OFF in the biasing configuration, and switches $S_3$ and $S_4$ are OFF and switches $S_1$ and $S_2$ are ON in the active configuration.

The load node may be connected in series with the switch $S_1$ and the load to the first voltage source node. Node $N_2$ may be connected in series with the switch $S_2$ and the current source to the second voltage source node.

The load may comprise first and second loads. The capacitor switching circuitry may be configured, in the active configuration, to conductively connect the load node to the first voltage source node via either the first load or the second load in dependence upon a data signal.

The switching circuitry may comprise switches $S_N$ and $S_P$. The load node may be connected via switch $S_N$ and the first load to the first voltage source node, and via switch $S_P$ and the second load to the first voltage source node. The capacitor switching circuitry may be configured, based on the data signal, such that either switch $S_N$ or switch $S_P$ is ON in the active configuration.

Switches $S_1$ to $S_4$ may (each) be implemented as a plurality of switches. For example, switch $S_1$ may comprise two switches, $S_N$ and $S_P$. A load may comprise first and second loads, and switch $S_1$ may be configured to conductively connect the load node to the first voltage source node via either the first load or the second load in dependence upon a data (digital) signal, meaning that switches $S_N$ and $S_P$ may be configured to conductively connect the load node to the first voltage source node via either the first load or the second load in dependence upon a data signal.

The switched current source circuit may comprise a plurality of sets of said capacitor switching circuitry.

The plurality of sets of said capacitor switching circuitry may be configured, based on the control signal, such that when one of the sets of capacitor switching circuitry is in its active configuration each other set of capacitor switching circuitry is in its biasing configuration.

The plurality of sets of capacitor switching circuitry may comprise at least three sets of capacitor switching circuitry, and the control signal may comprise at least one clock signal whose duty cycle is configured such that when one of the sets of capacitor switching circuitry is in its active configuration each other set of capacitor switching circuitry is in its biasing configuration.

According to a second aspect of the present invention there is provided a digital-to-analogue converter, or DAC circuitry, comprising the switched current source circuits according to the above first aspect of the present invention.

According to a third aspect of the present invention there is provided integrated circuitry, such as an IC chip, comprising the switched current source circuits according to the above first aspect of the present invention or the digital-to-analogue converter according to the above second aspect of the present invention.

According to a fourth aspect of the present invention there is provided a method of increasing a potential difference in a switched current source circuit. The switched current source circuit comprises first and second voltage source nodes, a load, a current source, and capacitor switching circuitry comprising a load node, a capacitor and a plurality of switches. The method comprises controlling the switches, based on a control signal, to adopt a biasing configuration followed by an active configuration. In the biasing configuration, the load node is conductively connected to the second voltage source node to bias a voltage level at the load node, and the capacitor is connected so that it at least partly charges. In the active configuration, the load node is conductively connected via the load to the first voltage source node and via the capacitor to the current source to increase a potential difference between the first voltage source node and the load node.

Reference will now be made, by way of example, to the accompanying drawings, of which:

FIG. 1, mentioned above, is a schematic diagram of a simple switched current source circuit;

FIG. 2, mentioned above, is a schematic diagram of a simple switched current source circuit, detailed compared to the circuit of FIG. 1;

FIG. 3 is a schematic diagram of a switched current source circuit (or simply current source circuit) 300 embodying the present invention.

The circuit 300 comprises first and second voltage source nodes (or voltage sources) $V_1$ and $V_2$, a load L, a current source $I_{SRC}$ and capacitor switching circuitry 310 (shown within a dashed box). The capacitor switching circuitry 310 (corresponding to the switching circuitry 110 of FIG. 1 and 210 of FIG. 2) comprises a load node $N_1$, a capacitor C and a plurality of switches, $S_1$ to $S_4$. Capacitor switching circuitry 310 may alternatively be referred to as a capacitor switching circuit 310.

The capacitor C has first and second terminals. The first terminal is denoted "−" as the −ve plate and the second terminal is denoted "+" as the +ve plate.

The capacitor switching circuitry 310 comprises switches $S_1$, $S_2$, $S_3$ and $S_4$, as mentioned above. The load node $N_1$ is connected via switch $S_1$ and the load L (which are connected in series) to the first voltage source node $V_1$, and via switch $S_3$ to the second voltage source node $V_2$. The capacitor C is connected between the load node $N_1$ and a node $N_2$. Node $N_2$ is connected to a third voltage source node $V_3$ via switch $S_4$, and via switch $S_2$ and the current source $I_{SRC}$ (which are connected in series) to the second voltage source node $V_2$.

Figure 3:
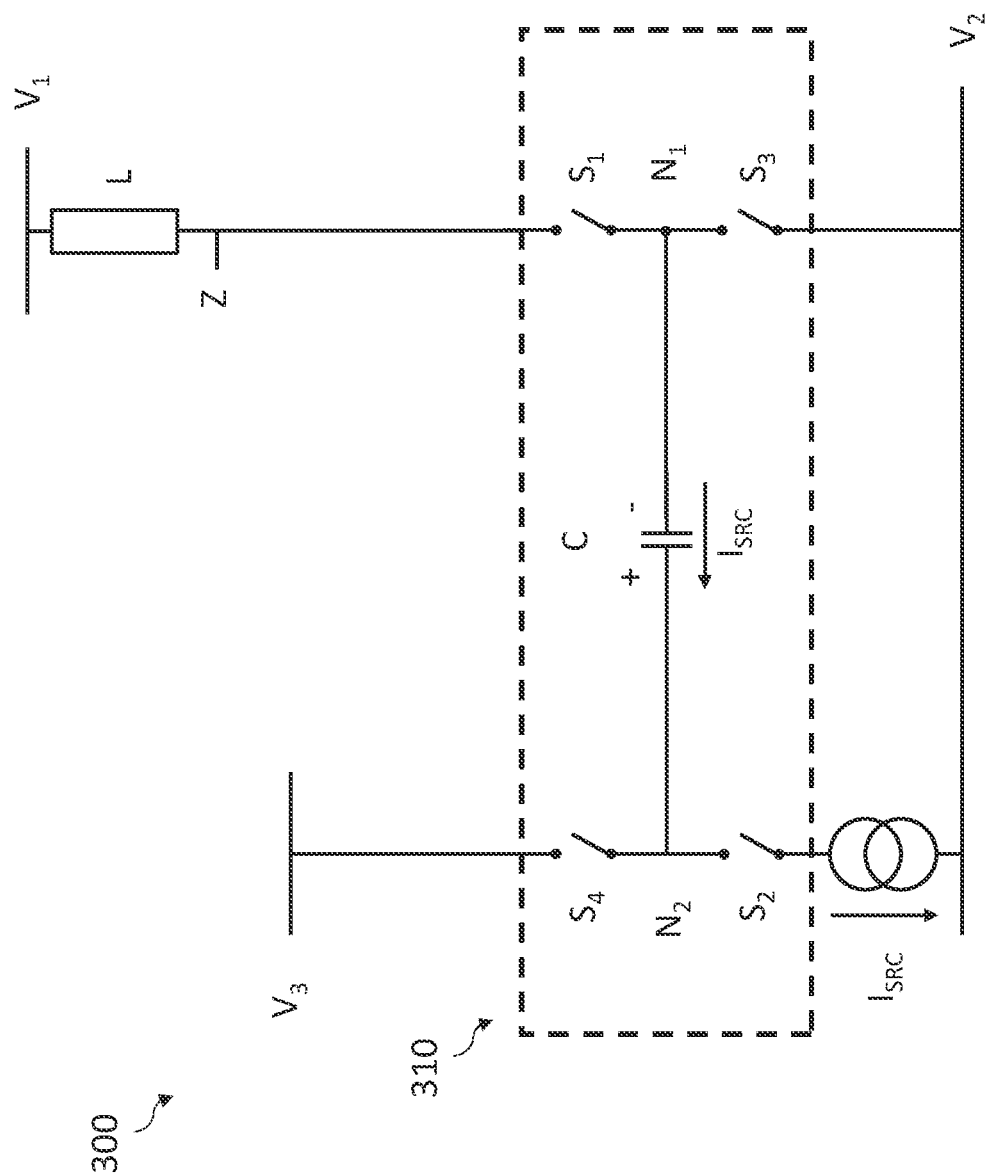
FIG. 3 is a schematic diagram of a switched current source circuit embodying the present invention.

In FIG. 3, the load node $N_1$ is shown connected via switch $S_3$ to the second voltage source node $V_2$, and the node $N_2$ is shown connected via switch $S_2$ and the current source $I_{SRC}$ also to the second voltage source node $V_2$. That is, the second voltage source node $V_2$, which may be at a ground or GND potential, is common to both terminals of the capacitor. On the other hand, the voltage source nodes $V_1$ and $V_3$ are shown as separate voltage source nodes $V_1$ and $V_3$.

In another arrangement, the voltage source nodes $V_1$ and $V_3$ may be connected together and referred to simply as the first voltage source node $V_1$. In yet another arrangement, the voltage source nodes $V_1$ and $V_3$ may be connected together and referred to simply as the first voltage source node $V_1$, and also the node $N_2$ may be connected via switch $S_2$ and the current source $I_{SRC}$ to a fourth voltage source node $V_4$ (not shown) separate from the second voltage source node $V_2$.

In the switched current source circuit 300 of FIG. 3, the first voltage source node $V_1$ is connected to an output node Z via the load L. The output node Z is connected to the load node $N_1$ via switch $S_1$. The load node $N_1$ is also connected to the second voltage source node $V_2$ via switch $S_3$. The first and second voltage source nodes $V_1$ and $V_2$ are configured to provide different voltage levels, such that if switches $S_1$ and $S_3$ were to be closed together, a potential difference would be seen across the load L.

The load node $N_1$ is also connected to the second voltage source node $V_2$ via a path comprising the capacitor C, node $N_2$, switch $S_2$ and the current source $I_{SRC}$. The load node $N_1$ may alternatively be described as being connected to the second voltage source node $V_2$ via the capacitor C, node $N_2$, switch $S_2$ and current source $I_{SRC}$ connected in series. Node $N_2$ is connected to the third voltage source node $V_3$ via switch $S_4$.

For simplicity and ease of explanation, one path connecting the load node $N_1$ to the first voltage source node $V_1$, and comprising one load L, will be considered. Logic gates ($G_N$ and $G_P$), optional additional (cascode) transistors ($S_{NCC}$ and $S_{PCC}$) and bleed current sources ($I_N$ and IP) have all been omitted, but shall be understood to be optional features as will be seen in later examples. A plurality of parallel connected paths will also be considered in a later example.

Each of switches $S_1$ to $S_4$ is controlled by a control signal (not shown). The control signal either opens or closes the respective switch.

Operation of the switched current source circuit 300 may best be described in two configurations, described herein as a biasing (or reset or voltage-setting or pre-charge) configuration and an active (or operational or voltage-shifting) configuration. Such configurations may be adopted in corresponding phases, i.e. biasing and active phases. The circuit is configured, based on a control signal or signals (not shown), to adopt the biasing configuration followed by the active configuration.

The first terminal of the capacitor C (−ve plate) is connected to the load node $N_1$ (i.e. is connected as such in both the biasing and active configurations), and the capacitor switching circuitry 310 is configured to connect the second terminal of the capacitor C (+ve plate) to the third voltage source node $V_3$ in the biasing configuration, and via the current source to the second voltage source node $V_2$ in the active configuration.

The capacitor switching circuitry 310 is configured, based on the control signal (not shown), to alternate between the biasing configuration and the active configuration. These configurations correspond to configurations of the switches $S_1$ to $S_4$ of the capacitor switching circuitry 310. Capacitor switching circuitry 310 is configured such that switches $S_3$ and $S_4$ are ON and switches $S_1$ and $S_2$ are OFF in the biasing configuration, and switches $S_3$ and $S_4$ are OFF and switches $S_1$ and $S_2$ are ON in the active configuration. Although not shown in FIG. 3, this could be achieved by controlling switches $S_3$ and $S_4$ with a clock signal CLK and switches $S_1$ and $S_2$ with the complementary clock signal CLK!, assuming all the switches respond to the clock signal in the same way (e.g. HIGH=ON, LOW=OFF).

Both configurations will now be described in more detail.

Figure 4:
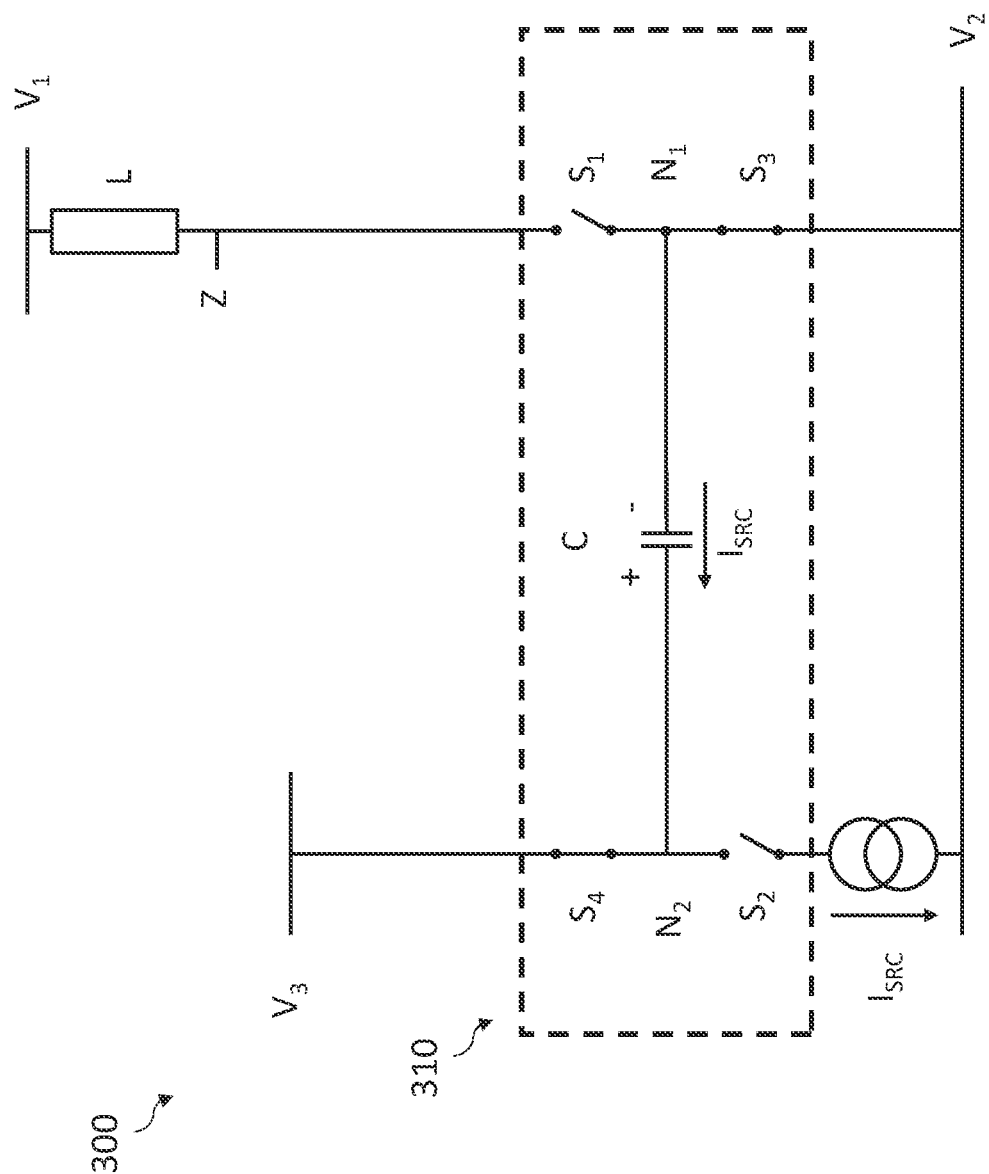
FIG. 4 is a schematic diagram of the switched current source circuit of FIG. 3 in a biasing configuration.

FIG. 4 is a schematic diagram of switched current source circuit 300 in the biasing configuration.

In the biasing configuration, the load node $N_1$ is connected (directly) to the second voltage source node $V_2$ (and disconnected from the first voltage source node $V_1$), and the capacitor C is connected so that it at least partly charges. In FIG. 4, switches $S_3$ and $S_4$ are closed (ON), and switches $S_1$ and $S_2$ are open (OFF). The capacitor C is thus connected between the third voltage source node $V_3$ (via switch $S_4$) and the second voltage source node $V_2$ (via switch $S_3$) so that the capacitor at least partly charges.

It is however envisaged that the capacitor C may be connected between any two voltage source nodes in the biasing configuration such that it at least partly charges (whether forming part of the circuit 300 or not), and the third voltage source node $V_3$ is given merely as one example of such a voltage source node.

Alternatively, as described above, the switch $S_4$ may be connected between node $N_2$ and the first voltage source node $V_1$ (equivalent to the first and third voltage source nodes $V_1$ and $V_3$ being connected together), such that in the biasing configuration the capacitor is connected between the load node $N_1$ and the first voltage source node $V_1$, and ultimately between the second voltage source node $V_2$ and the first voltage source node $V_1$ (via node $N_2$ and the load node $N_1$).

Over time (per cycle of being in the biasing configuration or over a succession of cycles of being in the biasing configuration), where the capacitor is not already fully charged (as is likely), the voltage across the capacitor begins to increase as more charge accumulates at the second terminal of the capacitor C (+ve plate). It is not essential that the capacitor reaches a fully charged state each time it is in the biasing configuration.

Since the load node $N_1$ is (conductively) connected to the second voltage source node $V_2$ in this configuration, the voltage at the load node $N_1$ in the biasing configuration is biased to (and ideally is the same as) the voltage of the second voltage source node $V_2$.

Figure 5:
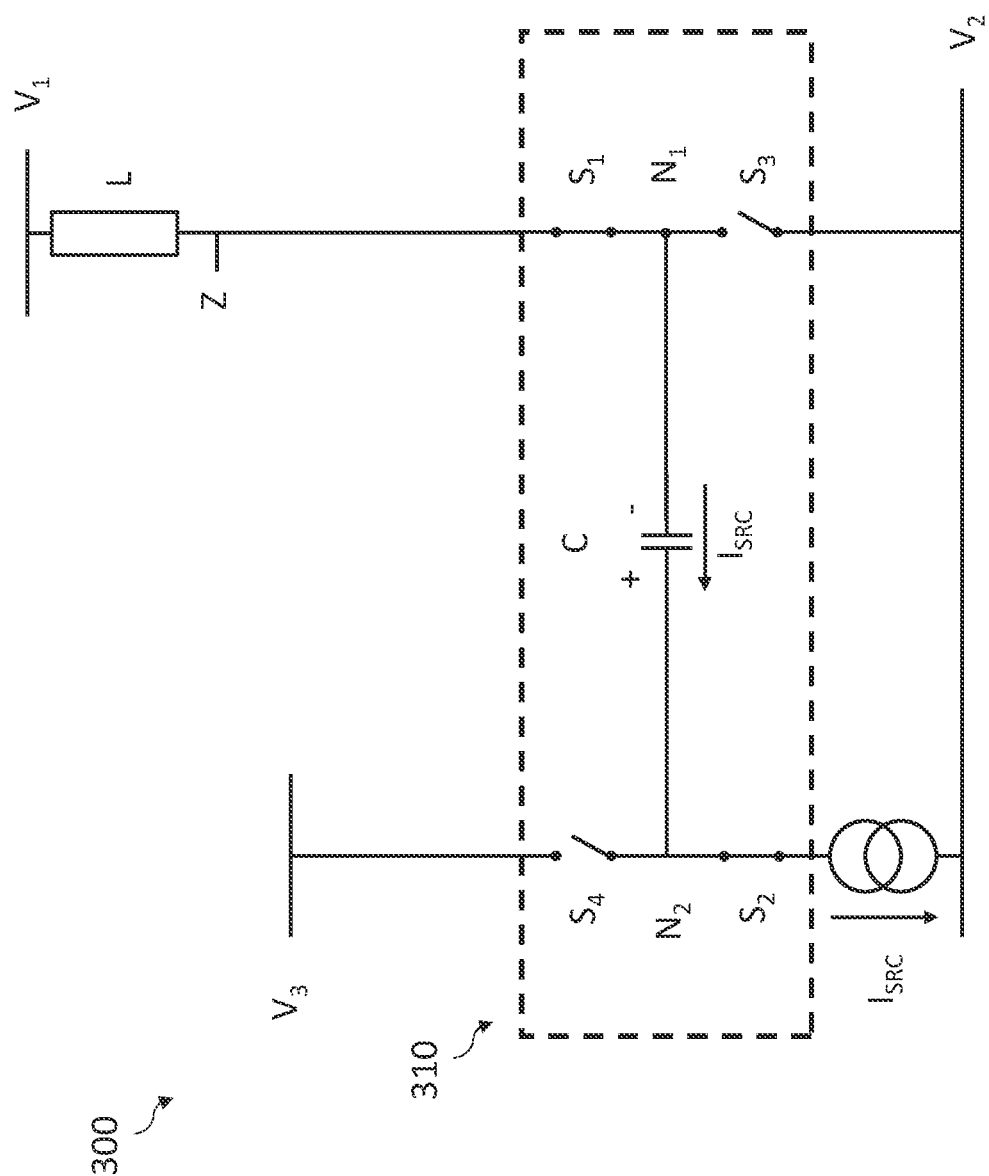
FIG. 5 is a schematic diagram of the switched current source circuit of FIG. 3 in an active configuration.

FIG. 5 is a schematic diagram of the switched current source circuit 300 in the active configuration.

In the active configuration, the load node $N_1$ is connected via the load L to the first voltage source node $V_1$, and via the capacitor C to the current source $I_{SRC}$ to increase a potential difference between the first voltage source node $V_1$ and the load node $N_1$. In FIG. 5, switches $S_1$ and $S_2$ are closed (ON), and switches $S_3$ and $S_4$ are open (OFF). The capacitor C (storing charge from the biasing configuration) is thus connected between the load node $N_1$ and the current source $I_{SRC}$ (the capacitor C thus being connected between the load node $N_1$, and the second voltage source node $V_2$ via the current source $I_{SRC}$.

Where the capacitor C was connected between any two voltage source nodes in the biasing configuration as mentioned earlier, the capacitor C is disconnected from these voltage source nodes in the active configuration and connected between the load node $N_1$ and the current source $I_{SRC}$.

In this active configuration, the current source $I_{SRC}$ begins to draw charge from the second terminal of the charged capacitor C (+ve plate). As charge is drawn, a corresponding charge is drawn into the first terminal of the capacitor C (−ve plate) via the load node $N_1$ (from the first voltage supply $V_1$). Effectively, a current $I_{SRC}$ drawn by the current source $I_{SRC}$ causes a corresponding current (of substantially the same magnitude) to flow through the load L and the load node $N_1$ as indicated. This causes the voltage at the load node $N_1$ to reduce (as the load node $N_1$, previously biased to the second voltage source node $V_2$, sees a voltage drop across the load L due to the current drawn into the first terminal of the capacitor C (−ve plate)).

Since the load node $N_1$ was at a voltage level equal to (or biased by) a voltage level at the second voltage source node $V_2$ at the end of the biasing configuration, the voltage level at the load node $N_1$ now reduces to a value below that of the second voltage source node $V_2$. Because of this, the active configuration may be referred to as a shifting or voltage-shifting configuration or phase, where the voltage at the second terminal of the capacitor C (+ve plate) and the load node $N_1$ is shifted (in this case, downwards).

This effect is desirable as it results in a voltage difference or potential difference between the first voltage source node $V_1$ and the load node $N_1$ ($V_1$-$N_1$) being greater than between the first voltage source node $V_1$ and the second voltage source node $V_2$ ($V_1$-$V_2$). This increases the voltage headroom of the circuit in the active configuration since a larger voltage (or potential difference) can exist across the load L.

For example, consider an implementation where $V_1$=1V, $V_2$=0V, $V_3$=1V, and where the charge stored by the capacitor is given by Q=C*V, where C is the capacitance of the capacitor C and V is the voltage across the capacitor C.

In the biasing configuration, the capacitor C is connected between third voltage source node $V_3$ and second voltage source node $V_2$. The capacitor C has a potential difference across its terminals equal to 1V ($V_3$-$V_2$), and begins to charge towards a charge Q=1*C. The load node $N_1$ is set to 0V (via switch $S_3$). The voltage difference between first voltage source node $V_1$ and second voltage source node $V_2$ is 1V (1V-0V).

In the active configuration, the capacitor C is connected between the load node $N_1$ and the current source $I_{SRC}$. The current source $I_{SRC}$ begins to draw charge from the second terminal of capacitor C (+ve plate), and the first terminal of capacitor C (-ve plate) begins to draw charge from the load node $N_1$ (from the first voltage source node $V_1$). As charge is drawn from the load node $N_1$, the voltage at the load node $N_1$ starts to reduce (to a value lower than that of the second voltage source node $V_2$). Therefore, the voltage at the load node $N_1$ decreases from 0V to -$\Delta$V, where $\Delta$V is a voltage difference. The potential difference between the first voltage source node $V_1$ and load node $N_1$ is thus 1V+$\Delta$V (1V-(-$\Delta$V)). The voltage difference $\Delta$V may depend on the capacitance of capacitor C, the length of time the circuit remains in the active configuration, and the total charge Q stored on the capacitor C.

The voltage headroom of the circuit has thus increased, since a larger potential difference exists between the first voltage source node $V_1$ and the load node $N_1$, allowing a larger voltage to be induced across the load.

In summary, the capacitor C is either being charged to a potential of the third voltage source node $V_3$ (assuming the second voltage source node $V_2$ is at ground) or is being used to cause a current to flow through the load L and load node $N_1$ based on the current $I_{SRC}$ drawn by the current source $I_{SRC}$. During the biasing configuration the current coming out of the second terminal of the capacitor C (+ve plate) is effectively also going into the first terminal of the capacitor C (-ve plate), via the switches $S_2$ and $S_1$ respectively. The capacitor C enables current to be drawn from (or pushed onto) the load node $N_1$ and allows the potential of the first terminal of the capacitor C (-ve plate) at the load node $N_1$ to go below the voltage of the second voltage source node $V_2$, thus effectively boosting the voltage headroom.

Figure 6:
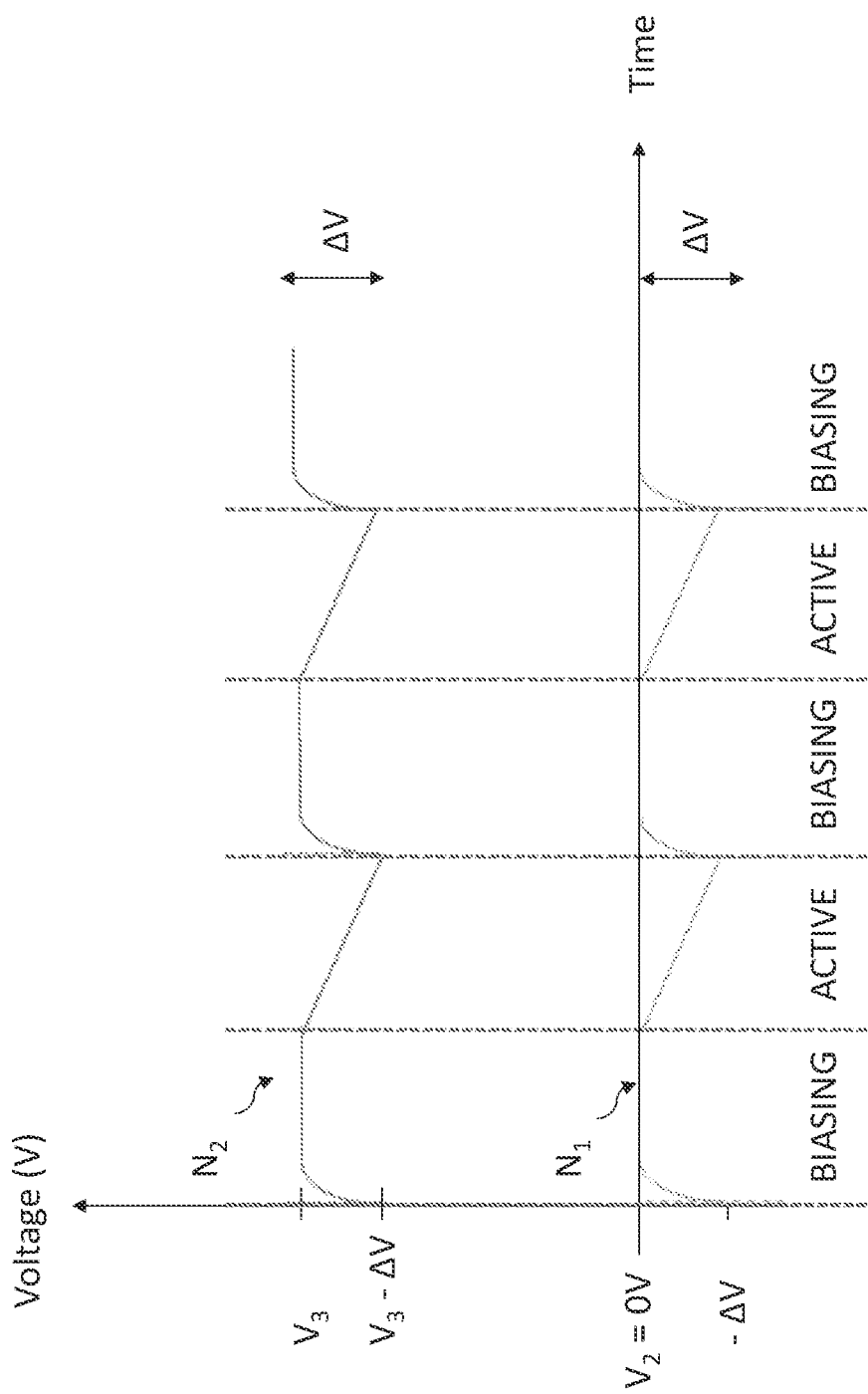
FIG. 6 is a timing diagram useful for understanding operation of the switched current source circuit of FIG. 3.

FIG. 6 is a timing diagram useful for understanding operation of circuit 300.

FIG. 6 shows two voltage waveforms plotting voltage versus time. The upper waveform, labelled $N_2$, shows the voltage at node $N_2$, or the second terminal of the capacitor C (+ve plate). The lower waveform, labelled $N_1$, shows the voltage at the load node $N_1$, or the first terminal of the capacitor C (-ve plate).

The waveforms have been divided into consecutive periods, marked by the dashed vertical lines passing through both waveforms. These periods correspond to the biasing and active configurations, and the timing diagram alternates between the two configurations as time goes on.

The timing diagram starts at the beginning of a period or phase corresponding to the biasing configuration.

In the biasing configuration, the capacitor C is connected between the third voltage source node $V_3$ and the second voltage source node $V_2$. The voltage at the second voltage source node $V_2$ is assumed to be 0V or ground. Waveform $N_2$ shows the voltage at the second terminal of the capacitor (+ve plate) charge up to, and then remain, at a voltage $V_3$ of the third voltage source node $V_3$.

In the biasing configuration, the load node $N_1$ is connected to the second voltage source node $V_2$. Waveform $N_1$ shows the voltage at the load node $N_1$ rise up to, and remain at, a voltage $V_2$ of the second voltage source node $V_2$ (assumed here to be 0V for simplicity as mentioned above).

The timing diagram then transitions into the next period or phase, corresponding to the active configuration.

In the active configuration, the capacitor C is connected between the second voltage source node $V_2$ via the current source $I_{SRC}$, and the first voltage source node $V_1$ via the load L. As mentioned earlier, the current $I_{SRC}$ drawn by the current source $I_{SRC}$ causes a corresponding current to flow through the load L and the load node $N_1$.

The voltage across the capacitor C remains constant, but as more charge is drawn by the current source $I_{SRC}$, the voltages at both the node $N_2$ and the load node $N_1$ reduce substantially at the same rate (assuming the voltage across the capacitor C remains constant), shown by downward gradients or slopes on the timing diagram for $N_2$ and $N_1$, and continue to decline at this rate throughout the duration of the active configuration as more charge is drawn by the current source $I_{SRC}$. The reduction (or difference) in voltage at each of the nodes $N_1$ and $N_2$ between the beginning and end of the active configuration is shown as $\Delta$V.

The timing diagram then transitions back into the active configuration and the waveforms repeat.

Ideally, after switching to the biasing configuration, the voltage at node $N_2$ would rise up to voltage $V_3$ instantaneously, however, in reality, the capacitor will take some time to fully charge. During switching, a small amount of charge stored on the capacitor C is lost and this is replenished in each period or phase when the circuit is in the biasing configuration. Ideally, after switching to the biasing configuration, the voltage at node $N_1$ would rise up to voltage $V_2$ instantaneously, however, in reality, the voltage at the load node $N_1$ may exhibit voltage overshooting (where the voltage momentarily rises above voltage $V_2$ before reducing and settling at voltage $V_2$ again) instead of a gradual rise (as shown in FIG. 6).

Figure 7:
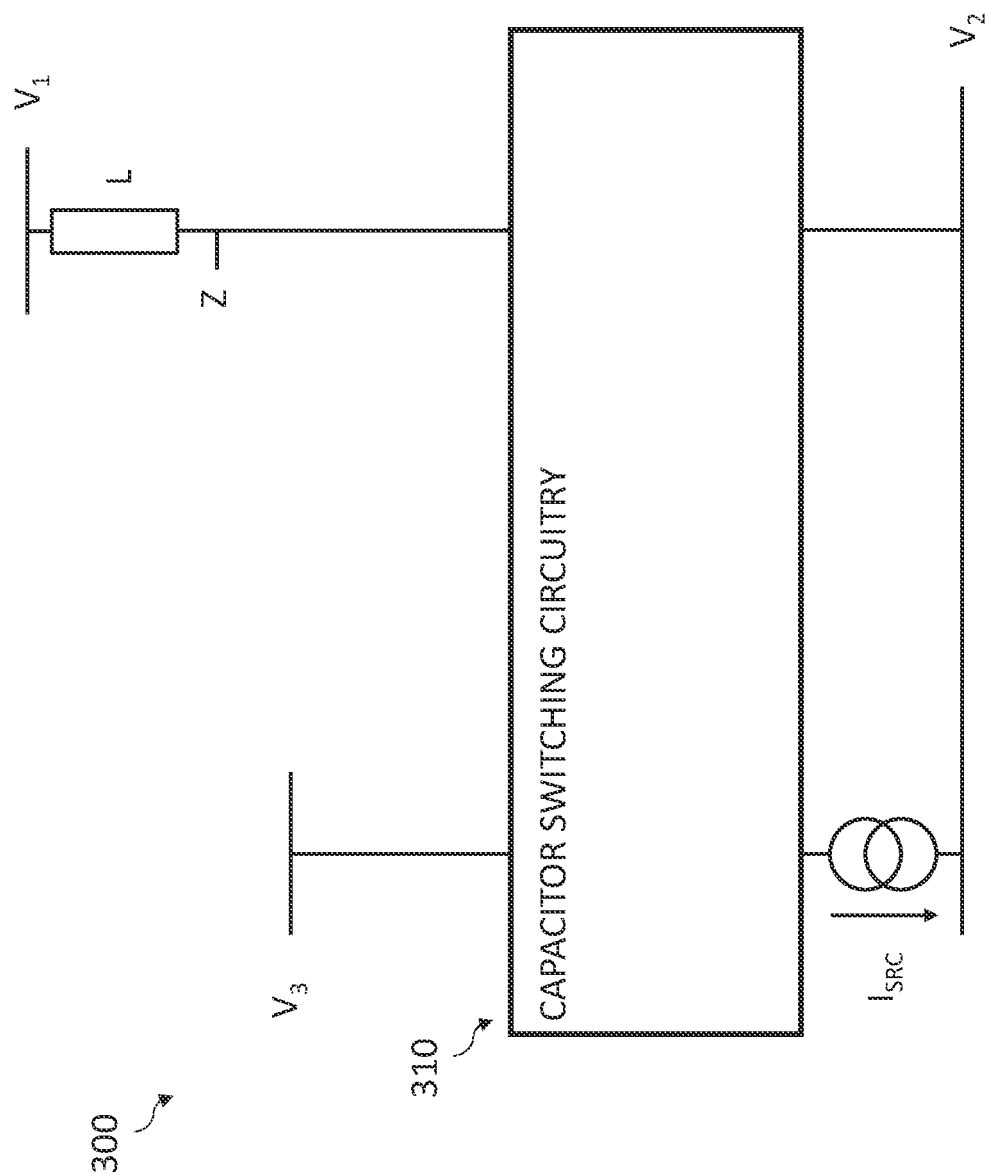
FIG. 7 is a schematic diagram presenting a simplified representation of the switched current source circuit of FIG. 3.

FIG. 7 is a schematic diagram presenting a simplified representation of the switched current source circuit 300, in which the capacitor switching circuitry 310 is shown in so-called black box form helpful for understanding further examples described herein.

Figure 8:
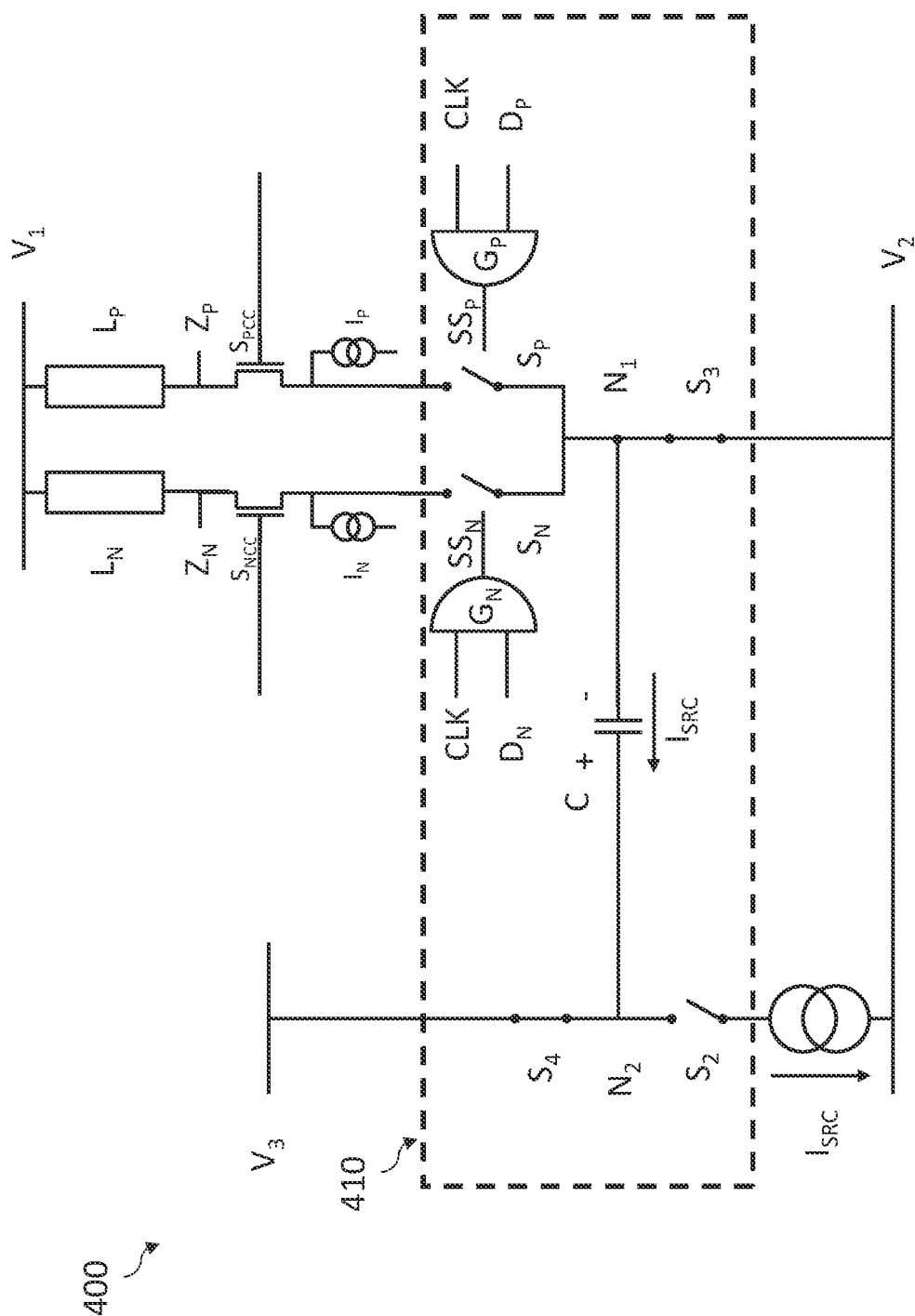
FIG. 8 is a schematic diagram presenting a switched current source circuit embodying the present invention, showing one possible implementation of the switched current source circuit of FIG. 3.

FIG. 8 is a schematic diagram presenting a switched current source circuit 400, showing one possible implementation of the circuit 300 corresponding to circuit 200. Circuit 400 comprises a load node $N_1$, second voltage source node $V_2$, capacitor C, third voltage source node $V_3$, node $N_2$, current source $I_{SRC}$ and switches $S_2$ to $S_4$ connected in the same way as explained previously with respect to FIG. 3. Repeat description is omitted.

In the circuit 400, and looking at circuit 300, the path from the load node $N_1$ to the first voltage source node $V_1$ has been replaced with parallel paths as in circuit 200, so that the load node $N_1$ may be referred to as a tail node. Thus, switches $S_N$ and $S_P$ together correspond to switch $S_1$, output nodes $Z_N$ and $Z_P$ together correspond to output node Z, and loads $L_N$ and LP together correspond to load L. Additional (cascode) transistors $S_{NCC}$ and $S_{PCC}$ and bleed current sources $I_N$ and $I_P$ have also been provided in line with circuit 200.

Similarly, logic gates $G_N$ and $G_P$, being AND gates, have been provided to drive switches $S_N$ and $S_P$, respectively, in line with circuit 200. As before, the logic gate $G_N$ is driven by clock signal CLK and data signal $D_N$ and the logic gate $G_P$ is driven by the clock signal CLK and data signal $D_P$. Output nodes $Z_N$ and $Z_P$ may be considered complementary analogue outputs corresponding to complementary digital inputs $D_N$ and $D_P$, as before.

Although not shown, it is assumed that switch $S_2$ is closed (ON) when CLK is HIGH and open (OFF) when CLK is LOW, and that switches $S_3$ and $S_4$ are closed (ON) when CLK is LOW and open (OFF) when CLK is HIGH.

Operation of circuit 400 is thus largely the same as that described in relation to FIGS. 3 to 6, and is achieved by alternating between a biasing and an active configuration as explained previously. However, during the active configuration, the current is steered, or directed, along one of the parallel connected paths (depending on the values of CLK, $D_P$ and $D_N$) as well as exhibiting the increased voltage headroom of circuit 300, available to the one of the loads $L_N$ and $L_P$ carrying current due to the parallel paths being connected to the same load node $N_1$.

The current source $I_{SRC}$ has been shown as a current source, and not two series connected transistors (as shown in FIG. 2) for simplicity. Such a circuit (with the current source implemented as two series connected transistors) may be considered equivalent to the circuit shown in FIG. 8.

While FIG. 8 shows two parallel connected paths (which may be preferable in differential DAC circuitry, to direct a current along either a negative or positive path or branch to generate a voltage across a negative or positive load), any number of parallel connected paths (comprising the same components and connected in the same way as previously described) may be envisaged. In order to steer, or direct, current along a particular parallel connected path, any number of logic gates or control signals (clock or data signals) may be used accordingly.

Figure 9:
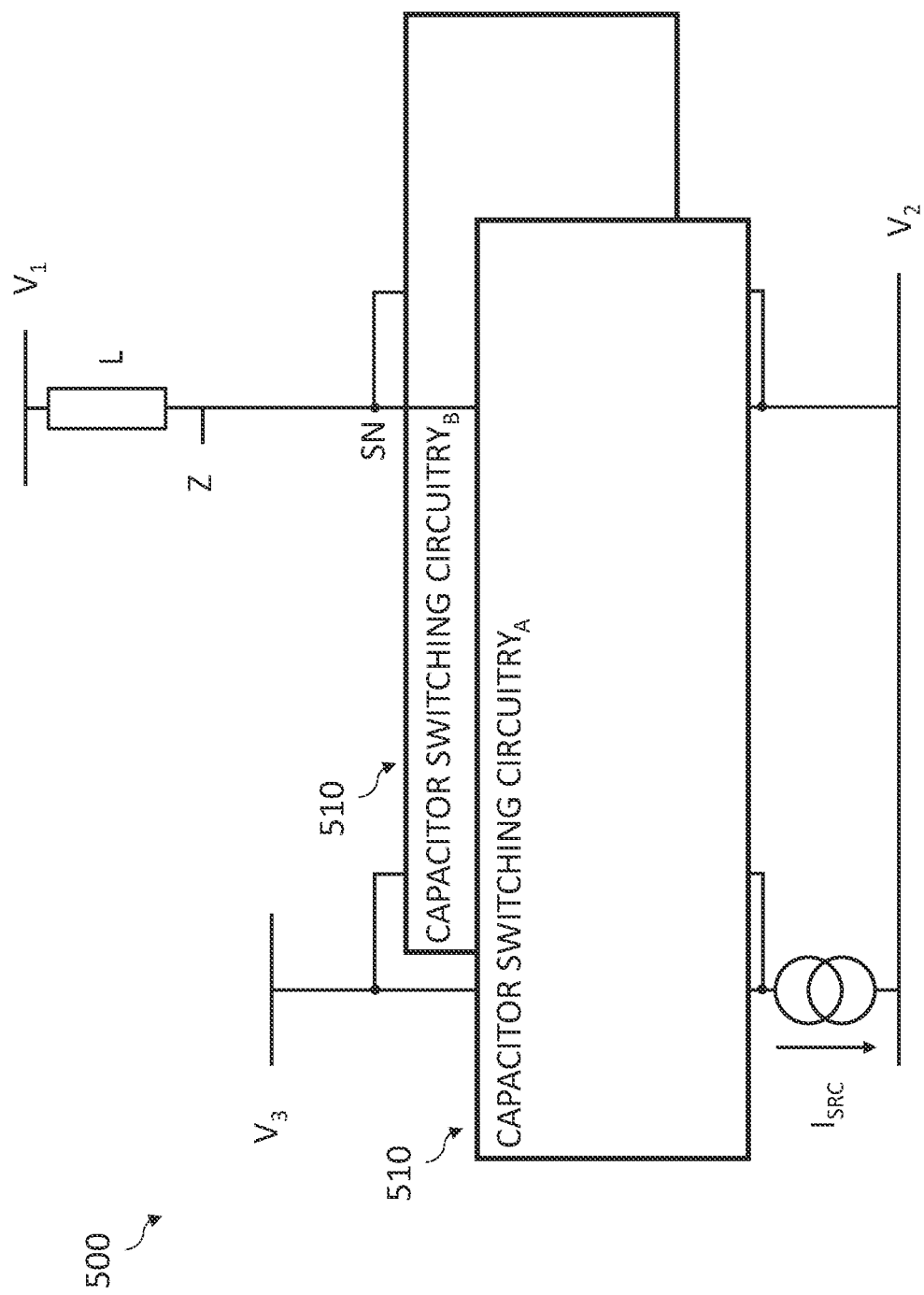
FIG. 9 is a schematic diagram presenting a switched current source circuit embodying the present invention, represented in simplified form and having a plurality of sets of capacitor switching circuitry.

FIG. 9 is a schematic diagram presenting a simplified switched current source circuit 500, showing a plurality of sets of capacitor switching circuitry 510 (corresponding to the capacitor switching circuitry 410 of FIG. 8). The diagram is presented in such a way as to make for straightforward comparison to FIG. 7.

The switched current source circuit 500 comprises a plurality of sets of said capacitor switching circuitry 510 (denoted as CAPACITOR SWITCHING CIRCUITRY$_A$ and CAPACITOR SWITCHING CIRCUITRY$_B$), connected in parallel. The parallel-connected sets of capacitor switching circuitry 510 share (or are connected to the same) first voltage source node $V_1$ (via the same output node Z and load L), second voltage source node $V_2$, current source $I_{SRC}$ and third voltage source node $V_3$.

Two sets of capacitor switching circuitry 510 connected in parallel may be of particular use when considering the two active and biasing configurations. Considering FIGS. 6 and 7 together, for example, where the biasing and active configurations alternate, and where each configuration is maintained for the same amount of time, the period when the voltage at the load node $N_1$ is being reduced occurs for only half of the total operating time of the circuit (i.e. only when in the active configuration).

Circuit 500 allows for the biasing and active configurations to be time-interleaved between the sets of capacitor switching circuitry 510. In a time-interleaved application (such as a current steering DAC) two (or more) such stages can be combined to give a continuous current into the load L. Thus, in the case of FIG. 9, the two sets of capacitor switching circuitry 510 are configured to be controlled by a control signal such as a clock signal such that when one of them (e.g. CAPACITOR SWITCHING CIRCUITRY$_A$) is in the active configuration the other (e.g. CAPACITOR SWITCHING CIRCUITRY$_B$) is in the biasing configuration, and vice versa.

Both sets of capacitor switching circuitry 510 are connected to the same load, each via its own switch $S_1$ (see e.g. FIG. 3). Current is drawn through the load L by the capacitor C and through the load node $N_1$ of the capacitor switching circuitry 510 currently in its active configuration (and connected to the load L via shared node $S_N$). Thus, the load L itself effectively sees a constant current corresponding to the current drawn by current source $I_{SRC}$, assuming the sets of capacitor switching circuitry 510 alternate between the biasing and active configurations with controlled overlap/underlap. Thus, the load L is always seeing an active configuration and getting the benefit of increased or increasing voltage headroom.

While FIG. 9 shows two sets of capacitor switching circuitry 510, any number of sets of capacitor switching circuitry 510 (comprising the same components and connected in the same way as previously described) may be envisaged. For the case where there are more than two sets of capacitor switching circuitry 510 connected in parallel, it may be that (at all times during operation) at least one of the sets of capacitor switching circuitry 510 is in the active configuration, and each other set of capacitor switching circuitry 510 is in the biasing configuration.

Switched current source circuit 500 is presented as a simplified example arrangement, but may be understood to take the form of any of the various alternative circuit configurations previously envisaged, including adopting the capacitor switching circuitry implementation 410 (and thus also the parallel connected paths and plurality of loads).

Figure 10:
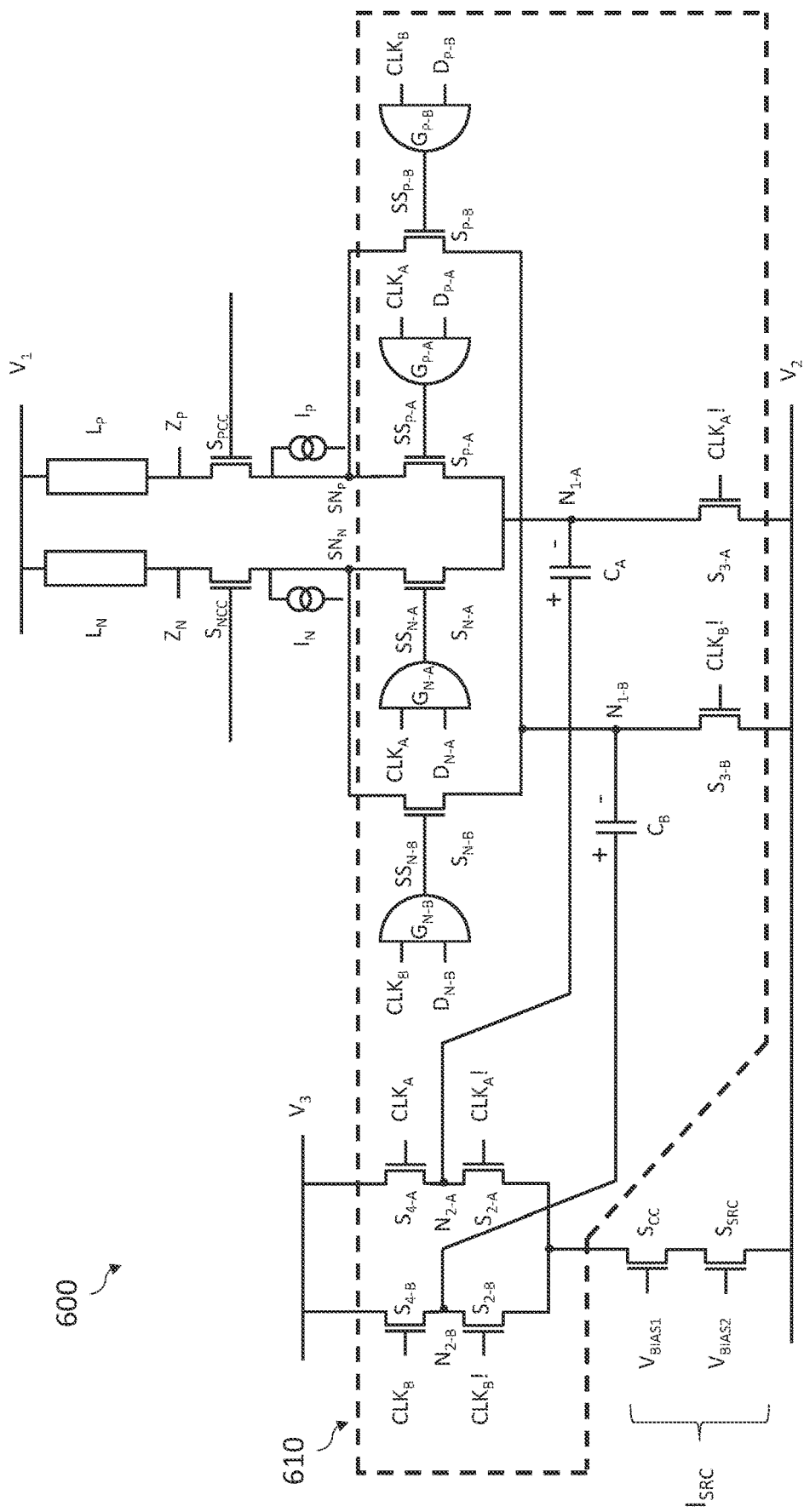
FIG. 10 is a schematic diagram presenting a switched current source circuit embodying the present invention, showing a detailed schematic and having a plurality of sets of capacitor switching circuitry, and is one possible implementation of the switched current source circuit of FIG. 9.

FIG. 10 is a schematic diagram presenting a switched current source circuit 600, showing a detailed implementation having a plurality of sets of capacitor switching circuitry (as in FIG. 9) and also parallel connected paths and a plurality of loads (as in FIG. 8). To aid in the comparison, shared nodes $SN_N$ and $SN_P$ (for the N and P parallel paths, respectively) in FIG. 10 together correspond to the shared node $S_N$ of FIG. 9.

Switched current source circuit 600 can be understood to have the same topology as switched current source circuit 400 but to comprise two sets of capacitor switching circuitry 410. One set of capacitor switching circuitry 410 is referred to as CAPACITOR SWITCHING CIRCUITRY$_A$ and the other set of capacitor switching circuitry 410 is referred to as CAPACITOR SWITCHING CIRCUITRY$_B$.

The components of CAPACITOR SWITCHING CIRCUITRY$_A$ and the components of CAPACITOR SWITCHING CIRCUITRY$_B$ are presented together in combined capacitor switching circuitry 610 (shown as a dashed box). Combined capacitor switching circuitry 610 is shown in this way in order to make comparison with the previously described circuits straightforward.

Where possible, components of circuit 600 that correspond to components of circuit 400 have been given like reference signs (e.g. loads $L_N$ and $L_P$ of the parallel connected paths).

The components outside the combined capacitor switching circuitry 610 may be understood based on FIG. 8, except that the current source $I_{SRC}$ has been implemented as series-connected (n-channel) field-effect transistors $S_{CC}$ and $S_{SRC}$ controlled by bias signals $V_{BIAS1}$ and $V_{BIAS2}$ respectively, in line with FIG. 2. The field-effect transistors $S_{NCC}$ and $S_{PCC}$ are also n-channel transistors in this arrangement. Thus, duplicate description is omitted.

Reference signs of the components within the combined capacitor switching circuitry 610 have been denoted with an additional suffix character A or B to denote whether the components belong to CAPACITOR SWITCHING CIRCUITRY$_A$ or CAPACITOR SWITCHING CIRCUITRY$_B$. For example, components denoted by an A subscript character (e.g. $G_{N-A}$, $N_{1-A}$) are components of CAPACITOR SWITCHING CIRCUITRY$_A$ and components denoted by a B subscript character (e.g. $G_{N-B}$, WO are components of CAPACITOR SWITCHING CIRCUITRY$_B$.

The combined capacitor switching circuitry 610 may thus be understood as two sets of capacitor switching circuitry 410, combined capacitor switching circuitry 610 comprising two of each component present in capacitor switching circuitry 410, distinguished from one another by the above mentioned subscript characters. In this way, FIG. 10 may be compared with FIG. 9. Each switch in circuit 400 has been presented as a transistor (field-effect transistor) in circuit 600, controlled by a control signal at its gate terminal. The transistors in FIG. 10 corresponding to switches $S_2$ and $S_4$ in FIG. 8 (i.e. $S_{2-A}$, $S_{2-B}$ and $S_{4-A}$, $S_{4-B}$) are implemented as p-channel transistors. The transistors in FIG. 10 corresponding to switches $S_N$, $S_P$ and $S_3$ in FIG. 8 (i.e. $S_{N-A}$, $S_{N-B}$ and $S_{P-A}$, $S_{P-B}$ and $S_{3-A}$, $S_{3-B}$) are implemented as n-channel transistors.

Each of CAPACITOR SWITCHING CIRCUITRY$_A$ and CAPACITOR SWITCHING CIRCUITRY$_B$ thus operates in the same way as capacitor switching circuitry 410, and duplicate description may be omitted. CAPACITOR SWITCHING CIRCUITRY$_A$ is controlled by clock signal (control signal) CLK$_A$ and complementary data signals $D_{N-A}$, $D_{P-A}$, corresponding respectively to CLK, $D_N$, $D_P$ of FIG. 8. Similarly, CAPACITOR SWITCHING CIRCUITRY$_B$ is controlled by clock signal (control signal) CLK$_B$ and complementary data signals $D_{N-B}$, $D_{P-B}$, corresponding respectively to CLK, $D_N$, $D_P$ of FIG. 8.

Switch $S_{3-A}$ is controlled by control signal CLK$_A$! (where CLK$_A$! is the inverse of CLK$_A$). Switch $S_{3-B}$ is controlled by control signal CLK$_B$! (where CLK$_B$! is the inverse of CLK$_B$). Switch $S_{4-A}$ is controlled by control signal CLK$_A$. Switch $S_{4-B}$ is controlled by control signal CLK$_B$. Switch $S_{2-A}$ is controlled by control signal CLK$_A$!. Switch $S_{2-B}$ is controlled by control signal CLK$_B$!. Clock signal CLK$_A$! denotes the inverse of clock signal CLK$_A$, and clock signal CLK$_B$! denotes the inverse of clock signal CLK$_B$.

By setting CLK$_A$ and CLK$_B$ to be complementary clock signals, it is therefore ensured that when CAPACITOR SWITCHING CIRCUITRY$_A$ is in its biasing configuration CAPACITOR SWITCHING CIRCUITRY$_B$ is in its active configuration and vice versa. Of course, FIG. 10 could thus be simplified by replacing CLK$_B$ with CLK$_A$!, so that only a single control signal CLK$_A$ is needed, however the A and B clock signals have been retained for ease of understanding.

Figure 11:
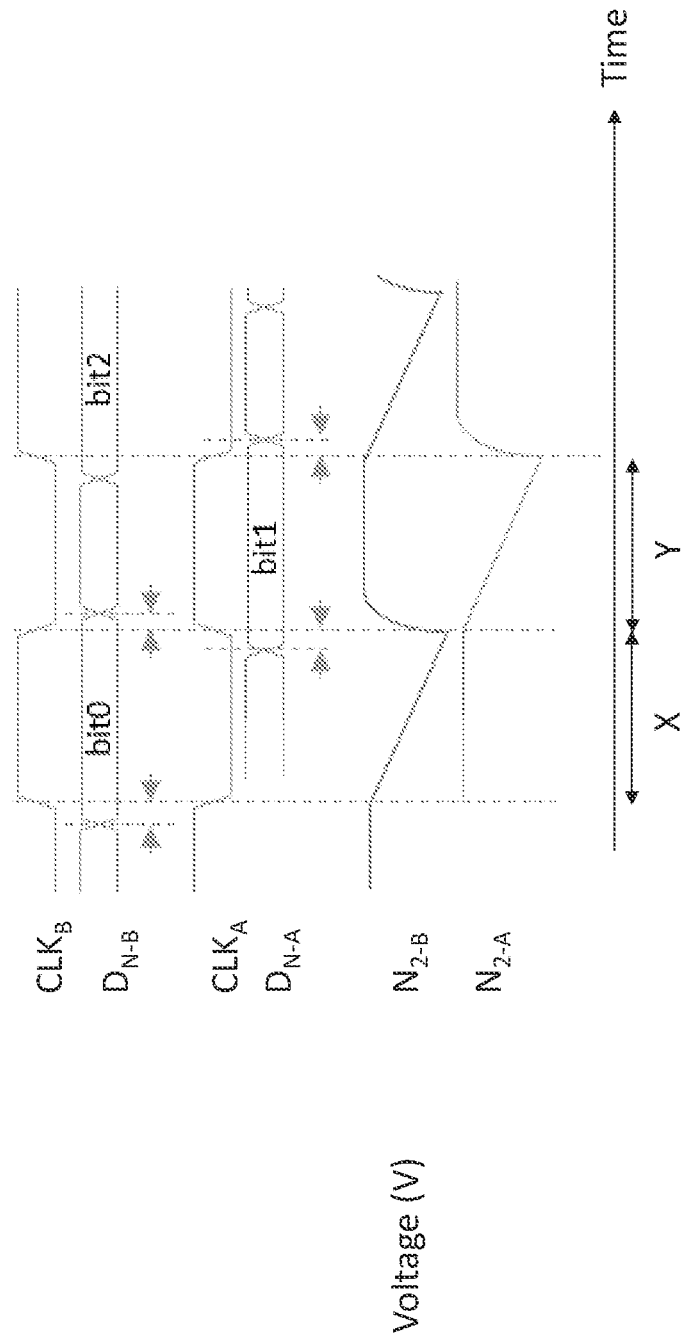
FIG. 11 is a timing diagram useful for understanding operation of the switched current source circuit of FIG. 10.

FIG. 11 is a timing diagram useful for understanding operation of circuit 600.

FIG. 11 shows waveforms of the four control and data signals CLK$_B$, $D_{N-B}$, CLK$_A$ and $D_{N-A}$, and the voltage waveforms at nodes $N_{2-B}$ and $N_2$-A. The values of each control and data signal may be considered digital values, and are either a 0 or a 1 except for at transitions, having corresponding voltage levels. $D_{P-A}$ and $D_{P-B}$ are assumed to be complementary to $D_{N-A}$ and $D_N$-B, respectively, and are thus not shown. The voltage waveforms at nodes $N_{2-B}$ and $N_{2-A}$ may be considered analogue signals, and take a value between $V_3$ and $V_3-\Delta V$, as explained in relation to FIG. 6 for node $N_2$.

Clock signals CLK$_A$ and CLK$_B$ alternate between a value of 0 and 1, transitioning between 0 and 1 at each clock cycle (or tick), shown as vertical dashed lines along the x axis, representing time.

Clock signal CLK$_A$ is HIGH (high voltage, logic level 1, or HI) when clock signal CLK$_B$ is LOW (low voltage, logic level 0, or LO) and clock signal CLK$_B$ is HIGH when clock signal CLK$_A$ is LOW.

Data signal $D_{N-A}$ is a data input to CAPACITOR SWITCHING CIRCUITRY$_A$ and data signal $D_{N-B}$ is a data signal input to CAPACITOR SWITCHING CIRCUITRY$_B$. In order to achieve time interleaving between the two sets of capacitor switching circuitry, the data signals are alternately input into CAPACITOR SWITCHING CIRCUITRY$_A$ and CAPACITOR SWITCHING CIRCUITRY$_B$. In other words, a stream of data bits may be split between the two sets of capacitor switching circuitry. This is shown on the timing diagram of FIG. 11 as data signal $D_{N-B}$ holding a data value for every even numbered bit (bit 0, bit 2 etc.), and $D_{N-A}$ holding a data value for every odd numbered bit (bit 1 etc.).

In a first example time period X, CAPACITOR SWITCHING CIRCUITRY$_A$ is in the biasing configuration and CAPACITOR SWITCHING CIRCUITRY$_B$ is in the active configuration. CLK$_B$ is HIGH and CLK$_A$ is LOW. Referring to FIG. 10, the clock signals are used to control the transistors. At time period X, $S_{4-B}$ is OFF, $S_{4-B}$, is ON, $S_{2-B}$ is ON, $S_{2-P}$, is OFF, $S_{3-B}$ is OFF, $S_3$-P, is ON. The transistors thus connect capacitor $C_A$ between the third voltage source node $V_3$ and second voltage source node $V_2$, and connect capacitor CB to the second voltage source node $V_2$ via the current source $I_{SRC}$. The voltage at node $N_{2-A}$ is therefore biased to the voltage at the third voltage source node $V_3$ (see FIG. 6) and the voltage at node $N_{2-B}$ ramps downwards from that level (again, see FIG. 6). Although not shown, the voltage at the load node $N_{1-A}$ is therefore biased to the voltage at the second voltage source node $V_2$ (see FIG. 6) and the voltage at the load node $N_{1-B}$ ramps downwards from that level (again, see FIG. 6).

In a subsequent second example time period Y, the reverse is true and the transistors thus connect capacitor $C_B$ between the third voltage source node $V_3$ and second voltage source node $V_2$, and connect capacitor CA to the second voltage source node $V_2$ via the current source $I_{SRC}$. The voltage at node $N_{2-B}$ is therefore biased to the voltage at the third voltage source node $V_3$ (see FIG. 6) and the voltage at node $N_{2-A}$ ramps downwards from that level (again, see FIG. 6). Although not shown, the voltage at the load node $N_{1-B}$ is therefore biased to the voltage at the second voltage source node $V_2$ (see FIG. 6) and the voltage at the load node $N_{1-A}$ ramps downwards from that level (again, see FIG. 6).

To ensure a constant current is always directed towards the load, $CLK_A$ and $CLK_B$ should be interleaved/timing adjusted to prevent underlap/optimize overlap. Also, the value of bit 0 is seen on data signal $D_{N-A}$ before the clock signals transition to their next value (or remains on the data signal after the transition) so a stable value is available. As already explained in connection with FIG. 8, the values of the data signals simply determine through which of the parallel load paths the current flows in the corresponding active configuration, i.e. whether the current flows through load $L_N$ or $L_P$ (and thus which of outputs $Z_N$ and $Z_P$ has the HIGH output and which has the LOW output).

While the periods of time determining the length of the biasing configuration and the active configurations are shown as being the same period of time in FIG. 11, this is merely one example implementation. The length of the biasing configuration and the active configuration may be different from one another, or the same, for example when there are three or more sets of capacitor switching circuitry.

As mentioned earlier, the switched current source circuit may have a plurality of sets of capacitor switching circuitry configured, based on the control signal, such that when one of the sets of capacitor switching circuitry is in its active configuration each other set of capacitor switching circuitry is in its biasing configuration. For example, the plurality of sets of capacitor switching circuitry may comprise at least three sets of capacitor switching circuitry, and the control signal may comprise at least one clock signal (or a set of three time-interleaved clock signals) whose duty cycle is configured such that when one of the sets of capacitor switching circuitry is in its active configuration each other set of capacitor switching circuitry is in its biasing configuration.

Where N number of sets of capacitor switching circuitry are used, N clock signals and 2N data signals corresponding to each set of capacitor switching circuitry may be implemented (a data signal $D_N$ and data signal $D_P$ for each capacitor switching circuitry). One clock signal may be HIGH at any given time, and corresponding data signals $D_N$ and $D_P$ may hold the value of the current bit (and its inverse or binary reciprocal) any given time.

In an example where there are four sets of capacitor switching circuitry, clock signals $CLK_A$, $CLK_B$, $CLK_C$, $CLK_D$ may be used, and data signals $D_{N-A}$, $D_{N-B}$, $D_{N-C}$, and $D_{N-D}$ may be used. The clock signals may be HIGH one by one in a cycle. For example, $CLK_A$ may be HIGH when $CLK_B$, $CLK_C$, $CLK_D$ are LOW. $CLK_B$ may be HIGH when $CLK_A$, $CLK_C$, $CLK_D$ are LOW and so on. The data signals may cycle holding the value of each bit. For example, $D_{N-A}$ may have the value of bit 0. $D_{N-B}$ may have the value of bit 1. $D_{N-C}$ may have the value of bit 3. $D_{N-D}$ may have the value of bit 4 and so on.

Figure 12:
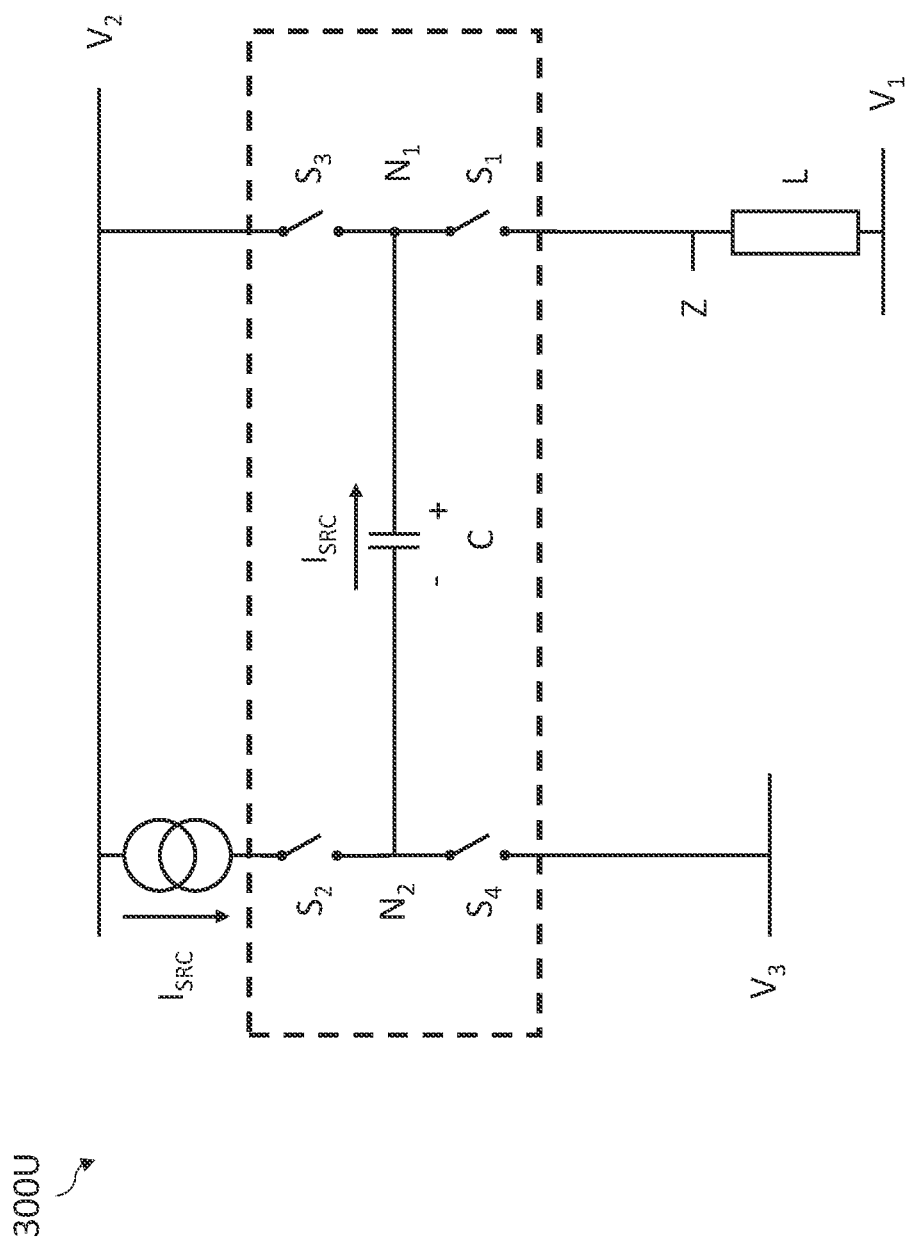
FIG. 12 is a schematic diagram of a switched current source circuit embodying the present invention.

FIG. 12 is a schematic diagram of a switched current source node circuit 300U embodying the present invention.

FIG. 12 shows a schematic diagram of a circuit 300 of FIG. 3, connected as previously explained, but presented "upside-down". Thus, in this example, the second voltage source node $V_2$ has a voltage larger than that of the first voltage source node $V_1$ and, in the active configuration, charge is deposited on the –ve plate of the capacitor C by the current source $I_{SRC}$ (by drawing current from the second voltage source node $V_2$), and consequently onto the load node $N_1$, increasing the voltage at the load node $N_1$.

The circuit of FIG. 3 increases the voltage headroom by increasing the difference between the voltage source nodes connected to either side of the load ($V_1$ and $V_2$). It is thus envisaged that rather than reducing a voltage at the load node $N_1$ to increase the voltage headroom as in FIG. 3 (by reducing the voltage at the load node $N_1$ to a voltage below that of the second voltage source node $V_2$), the voltage at the load node $N_1$ can instead be raised to achieve effectively the same result in FIG. 6 (by increasing the voltage at the load node $N_1$ to a voltage above that of the second voltage source node $V_2$).

It is envisaged that while FIG. 12 shows only the circuit of FIG. 3 shown in the "upside-down" orientation, any of the previously considered circuits of FIGS. 3 to 9 could be implemented similarly "upside down" following the same principles.

Figure 13:
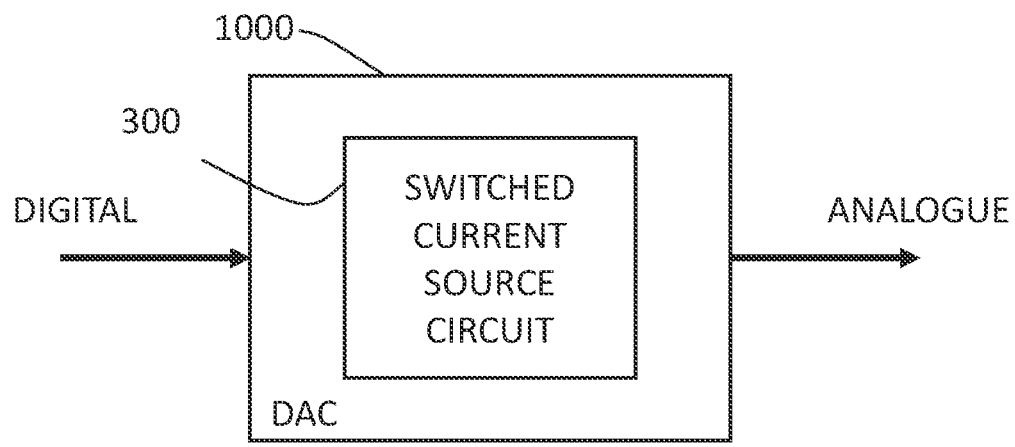
FIG. 13 is a schematic diagram of a digital-to-analogue converter, or DAC, circuit (or circuitry) 1000 embodying the present invention.

FIG. 13 is a schematic diagram of digital-to-analogue converter, or DAC, circuit (or circuitry) 1000 embodying the present invention. Such a digital-to-analogue converter circuit may comprise one or more instances of any of the switched current source circuits described herein, such as circuit 300. For example, looking at FIG. 8, output nodes $Z_N$ and $Z_P$ may be considered complementary analogue outputs corresponding to complementary digital inputs $D_N$ and $D_P$, as mentioned earlier.

Figure 14:
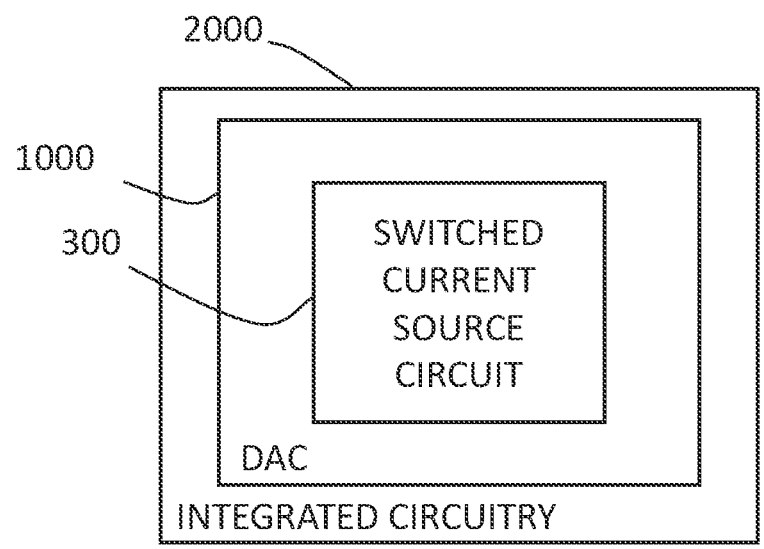
FIG. 14 is a schematic diagram of an integrated circuit (or circuitry) 2000 embodying the present invention.

FIG. 14 is a schematic diagram of an integrated circuit (or circuitry) 2000 embodying the present invention. Such integrated circuitry may comprise any of the switched current source circuits described herein, and/or the digital-to-analogue converter circuit 1000. Such integrated circuitry may be representative of some or all of an IC chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

The present invention may be embodied in many different ways in the light of the above disclosure, within the scope of the appended claims.

The invention claimed is:

1. A switched current source circuit, comprising:
   first and second voltage source nodes;
   a load;
   a current source; and
   capacitor switching circuitry comprising a load node, a capacitor and a plurality of switches configured, based on a control signal, to adopt a biasing configuration followed by an active configuration,
   wherein:
   in the biasing configuration, the load node is conductively connected to the second voltage source node to bias a voltage level at the load node, and the capacitor is connected so that it at least partly charges;
   in the active configuration, the load node is conductively connected via the load to the first voltage source node, and via the capacitor to the current source to increase a potential difference between the first voltage source node and the load node,
   said load comprises first and second loads; and
   the capacitor switching circuitry is configured, in the active configuration, to conductively connect the load node to the first voltage source node via either the first load or the second load in dependence upon a data signal.

2. The switched current source circuit of claim 1, wherein, in the active configuration, a current controlled by the current source causes a current to flow through the load and the load node and thereby increases the potential difference between the first voltage source node and the load node.

3. The switched current source circuit of claim 1, wherein the capacitor switching circuitry is configured, based on the control signal, to alternate between the biasing configuration and the active configuration.

4. The switched current source circuit of claim 1, wherein:
the capacitor has first and second terminals;
the first terminal is connected to the load node in the biasing and active configurations; and
the capacitor switching circuitry is configured to conductively connect the second terminal to the first voltage source node or another voltage source node in the biasing configuration and via the current source to the second voltage source node in the active configuration.

5. The switched current source circuit of claim 4, wherein, in the active configuration, the current source causes a current to flow at the second terminal of the capacitor and the capacitor causes an equivalent or the same current to flow at the first terminal of the capacitor, thereby increasing said potential difference between the first voltage source node and the load node.

6. The switched current source circuit of claim 1, wherein, in the active configuration, the voltage level at the load node is shifted or adjusted or changed to a value further from the voltage level of the first voltage source node than the voltage level of the second voltage source node.

7. The switched current source circuit of claim 1, wherein:
the capacitor switching circuitry comprise switches $S_1$, $S_2$, $S_3$ and $S_4$;
the load node is connected via switch $S_1$ and the load to the first voltage source node, and via switch $S_3$ to the second voltage source node;
the capacitor is connected between the load node and a node $N_2$;
node $N_2$ is connected to the first voltage source node or another voltage source node via switch $S_4$, and via switch $S_2$ and the current source to the second voltage source node; and
the capacitor switching circuitry is configured, based on the control signal, such that switches $S_3$ and $S_4$ are ON and switches $S_1$ and $S_2$ are OFF in the biasing configuration, and switches $S_3$ and $S_4$ are OFF and switches $S_1$ and $S_2$ are ON in the active configuration.

8. The switched current source circuit of claim 7, wherein:
the load node is connected in series with the switch $S_1$ and the load to the first voltage source node; and/or
node $N_2$ is connected in series with the switch $S_2$ and the current source to the second voltage source node.

9. The switched current source circuit of claim 1, wherein:
the capacitor switching circuitry comprise switches $S_N$ and $S_P$;
the load node is connected via switch $S_N$ and the first load to the first voltage source node, and via switch $S_P$ and the second load to the first voltage source node; and
the capacitor switching circuitry is configured, based on the data signal, such that either switch $S_N$ or switch $S_P$ is ON in the active configuration.

10. The switched current source circuit of claim 1, comprising a plurality of sets of said capacitor switching circuitry.

11. The switched current source circuit of claim 10, wherein the plurality of sets of said capacitor switching circuitry are configured, based on the control signal, such that when one of the sets of capacitor switching circuitry is in its active configuration each other set of capacitor switching circuitry is in its biasing configuration.

12. The switched current source circuit of claim 10, wherein the plurality of sets of capacitor switching circuitry comprises at least three sets of capacitor switching circuitry, and wherein the control signal comprises at least one clock signal whose duty cycle is configured such that when one of the sets of capacitor switching circuitry is in its active configuration each other set of capacitor switching circuitry is in its biasing configuration.

13. A digital-to-analogue converter comprising the switched current source circuit as claimed in claim 1.

14. Integrated circuitry comprising the switched current source circuit as claimed in claim 1.

15. Integrated circuitry comprising the digital-to-analogue converter as claimed in claim 13.

16. A switched current source circuit, comprising:
first and second voltage source nodes;
a load;
a current source; and
capacitor switching circuitry comprising a load node, a capacitor and a plurality of switches configured, based on a control signal, to adopt a biasing configuration followed by an active configuration,
wherein:
in the biasing configuration, the load node is conductively connected to the second voltage source node to bias a voltage level at the load node, and the capacitor is connected so that it at least partly charges;
in the active configuration, the load node is conductively connected via the load to the first voltage source node, and via the capacitor to the current source to increase a potential difference between the first voltage source node and the load node; and
the switched current source circuit comprising a plurality of sets of said capacitor switching circuitry, wherein the plurality of sets of said capacitor switching circuitry are configured, based on the control signal, such that when one of the sets of capacitor switching circuitry is in its active configuration each other set of capacitor switching circuitry is in its biasing configuration.

17. A switched current source circuit, comprising:
first and second voltage source nodes;
a load;
a current source; and
capacitor switching circuitry comprising a load node, a capacitor and a plurality of switches configured, based on a control signal, to adopt a biasing configuration followed by an active configuration,
wherein:
in the biasing configuration, the load node is conductively connected to the second voltage source node to bias a voltage level at the load node, and the capacitor is connected so that it at least partly charges;
in the active configuration, the load node is conductively connected via the load to the first voltage source node, and via the capacitor to the current source to increase a potential difference between the first voltage source node and the load node; and
the switched current source circuit comprising a plurality of sets of said capacitor switching circuitry, wherein the plurality of sets of capacitor switching circuitry comprises at least three sets of capacitor switching circuitry, and wherein the control signal comprises at least one clock signal whose duty cycle is configured such that when one of the sets of capacitor switching circuitry is in its active configuration each other set of capacitor switching circuitry is in its biasing configuration.

18. A differential digital-to-analog converter, comprising:
first and second voltage source nodes;
first and second loads;

a current source; and capacitor switching circuitry comprising a load node, a capacitor and a plurality of switches configured, based on a control signal, to adopt a biasing configuration followed by an active configuration, wherein:

in the biasing configuration, the load node is conductively connected to the second voltage source node to bias a voltage level at the load node, and the capacitor is connected so that it at least partly charges; and in the active configuration, the load node is conductively connected via the first load or the second load to the first voltage source node, and via the capacitor to the current source to increase a potential difference between the first voltage source node and the load node, and further wherein:

the capacitor switching circuitry comprises a first switch and a second switch;

the load node is connected via the first switch, a first output node and the first load to the first voltage source node, and via the second switch, a second output node and the second load to the first voltage source node; and the differential digital-to-analog converter is configured, in the active configuration, to conductively connect the load node to the first voltage source node via the first switch or via the second switch and steer a current via either the first load or the second load respectively in dependence upon differential digital input data signals, such that either the first switch or the second switch is ON in the active configuration, and differential analogue output signals are seen at first and second output nodes.

* * * * *